United States Patent
Cadloni

(10) Patent No.: US 10,242,751 B2
(45) Date of Patent: *Mar. 26, 2019

(54) METHOD AND APPARATUS FOR PROVIDING PRELOADED NON-VOLATILE MEMORY CONTENT

(71) Applicant: Micron Technology, Inc., Boise, ID (US)

(72) Inventor: Gerald L. Cadloni, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 487 days.

This patent is subject to a terminal disclaimer.

(21) Appl. No.: 14/730,062

(22) Filed: Jun. 3, 2015

(65) Prior Publication Data
US 2015/0294737 A1 Oct. 15, 2015

Related U.S. Application Data

(63) Continuation of application No. 13/091,933, filed on Apr. 21, 2011, now Pat. No. 9,082,474.

(51) Int. Cl.
*G11C 29/00* (2006.01)
*G11C 29/38* (2006.01)
*G11C 7/20* (2006.01)
*G11C 29/56* (2006.01)
*G06F 3/06* (2006.01)
(Continued)

(52) U.S. Cl.
CPC ............ *G11C 29/38* (2013.01); *G06F 3/0604* (2013.01); *G06F 3/0632* (2013.01); *G06F 3/0679* (2013.01); *G11C 7/20* (2013.01); *G11C 29/36* (2013.01); *G11C 29/56004* (2013.01); *G11C 29/56008* (2013.01); *G11C 2029/4402* (2013.01)

(58) Field of Classification Search
CPC .......... G11C 29/38; G11C 7/20; G11C 29/36; G11C 29/56004; G11C 29/56008; G11C 2029/4402; G11C 29/56; G11C 29/48; G11C 29/44; G11C 29/50; G11C 29/52; G11C 29/12; G06F 3/0604; G06F 3/0632; G06F 3/0679; H05K 999/99
USPC ........................................................ 714/718
See application file for complete search history.

(56) References Cited

U.S. PATENT DOCUMENTS 5,012,187 A 4/1991 Littlebury
5,818,848 A 10/1998 Lin et al.
(Continued)

OTHER PUBLICATIONS

Roel Boumen, Integration and Test Plans for Complex Manufacturing Systems, Dec. 2007, IPA (Institute for Programming Research and Algorithmics), IPA dissertion series 2007-12, Netherlands.
(Continued)

*Primary Examiner* — Albert Decady
*Assistant Examiner* — Enamul M Kabir
(74) *Attorney, Agent, or Firm* — Pritzkau Patent Group, LLC

(57) ABSTRACT

An embodiment providing one or more improvements includes a memory loading system and method for at least managing testing of a memory unit using a memory test system and responsive to at least completion of testing and passing the testing, loading non-testing content into the memory unit for delivery to a customer.

27 Claims, 4 Drawing Sheets

(51) Int. Cl.
  *G11C 29/36* (2006.01)
  *G11C 29/44* (2006.01)

(56) References Cited

U.S. PATENT DOCUMENTS

| | | | |
|---|---|---|---|
| 6,182,253 B1 * | 1/2001 | Lawrence | G11C 29/50 |
| | | | 365/201 |
| 6,351,827 B1 * | 2/2002 | Co | G01R 31/01 |
| | | | 714/29 |
| 6,357,022 B1 * | 3/2002 | Nguyen | G01R 31/01 |
| | | | 714/42 |
| 7,274,304 B2 | 9/2007 | Hall et al. | |
| 7,395,472 B2 * | 7/2008 | Nilson | G11C 16/102 |
| | | | 714/727 |
| 7,702,984 B1 | 4/2010 | Lee et al. | |
| 7,814,377 B2 | 10/2010 | Stolero et al. | |
| 8,013,332 B2 * | 9/2011 | Middlekauff | H01L 23/60 |
| | | | 235/492 |
| 2003/0074611 A1 | 4/2003 | Nachumovsky | |
| 2003/0078749 A1 | 4/2003 | Eberle et al. | |
| 2004/0076044 A1 * | 4/2004 | Nowshadi | G06F 12/0607 |
| | | | 365/200 |
| 2005/0193233 A1 | 9/2005 | Magliocco et al. | |
| 2006/0161725 A1 * | 7/2006 | Lee | G06F 3/0607 |
| | | | 711/103 |
| 2006/0216841 A1 | 9/2006 | Murin et al. | |
| 2007/0061637 A1 * | 3/2007 | Ward | G11C 29/006 |
| | | | 714/718 |
| 2008/0000971 A1 | 1/2008 | Lu et al. | |
| 2008/0143361 A1 * | 6/2008 | Casterton | G01R 31/2893 |
| | | | 324/757.01 |
| 2008/0177922 A1 | 7/2008 | Chow et al. | |
| 2008/0222368 A1 | 9/2008 | Gehrmann | |
| 2009/0013229 A1 | 1/2009 | Taylor et al. | |
| 2009/0089637 A1 | 4/2009 | Jun | |
| 2009/0210600 A1 | 8/2009 | Jeddeloh | |
| 2010/0002512 A1 * | 1/2010 | Cornwell | G11C 29/88 |
| | | | 365/185.09 |
| 2010/0070693 A1 | 3/2010 | Conley | |
| 2010/0074024 A1 | 3/2010 | Roohparvar | |
| 2010/0110786 A1 | 5/2010 | Kang et al. | |
| 2010/0199135 A1 * | 8/2010 | Murin | G11C 29/1201 |
| | | | 714/722 |
| 2010/0275073 A1 * | 10/2010 | Lasser | G11C 29/08 |
| | | | 714/718 |
| 2011/0010698 A1 | 1/2011 | Byom et al. | |
| 2011/0075482 A1 * | 3/2011 | Shepard | G11C 11/5621 |
| | | | 365/185.11 |
| 2011/0239064 A1 * | 9/2011 | Byom | G06F 11/1048 |
| | | | 714/723 |
| 2012/0023356 A1 | 1/2012 | Byom et al. | |
| 2012/0240128 A1 | 9/2012 | Alofs et al. | |

OTHER PUBLICATIONS

James S. Clark, Alpha Testing and Beta Testing, May 21, 2010, EzineArticles.com.

\* cited by examiner

METHOD AND APPARATUS FOR PROVIDING PRELOADED NON-VOLATILE MEMORY CONTENT

RELATED APPLICATION

This application is a continuation application of copending U.S. patent application Ser. No. 13/091,933 filed on Apr. 21, 2011, the disclosure of which is incorporated herein by reference.

BACKGROUND

The present application is related generally to the field of non-volatile memory and, more particularly, a method and apparatus that provides preloaded non-volatile memory content.

A non-volatile memory storage device such as, for example, a flash memory is generally produced in a memory manufacturing facility and is later shipped to a customer who incorporates the memory device into a storage product before selling the storage product to a wholesaler or end user. For quality assurance purposes, the memory device is typically subjected to some degree of testing by the manufacturer to ensure proper operation of the memory device. Memory devices that pass the testing can then be shipped to the customer for use in the memory product. Memory devices, as provided to customers of the manufacturer, can be in many different forms, such as a Thin Small-Outline Package (TSOP), or a Ball Grid Array (BGA) package and others. The customer can then incorporate the memory device into the memory product (for example, the customer can prepare the devices for the end user to use in the form of a USB flash drive, an SD or microSD card, a MMC or in another form).

The memory device can be manufactured in a wide variety of configurations with a wide range of different forms of external interface. Suitable forms of external interface include, by way of non-limiting example, USB, SD, MMC, ONFi, JTAG, I2C or others. Accordingly, the memory devices are typically tested at the manufacturing facility using the interface that is provided as part of the memory device. The testing can be performed, for example, using a dedicated test system that can be interfaced to a bank (e.g., a plurality) of the memory devices.

The memory test equipment generally includes a computer that has been customized for purposes of testing the memory of interest. In this regard, there have been approaches which favor testing non-volatile memory in other ways. In one of these approaches, the memory devices themselves are configured with self test capabilities, as opposed to using a dedicated external memory test system such that the memory test equipment at least manages the testing. Incorporation of self test capabilities can involve the inclusion of many additional electronic components such as, for example, processors, registers, buffers, and the like.

Customers of the manufacturer often receive such non-volatile memory devices from the manufacturer and proceed to load content onto the non-volatile memory that is dedicated for a particular end use of the memory product. Customers can also perform many desired levels of testing on the memory device, including verification of the content. One exception to customer testing is testing which yields a defect map. Defect maps typically can be generated by memory test equipment at the manufacturing facility which often simultaneously tests a plurality of the memory devices.

Once the non-volatile memory devices leave the manufacturer, it is generally left up to the customer of the manufacturer to load any desired content onto each non-volatile memory device based on an intended use of the memory device. This content can include program content and/or data content.

The foregoing examples of the related art and limitations related therewith are intended to be illustrative and not exclusive. Other limitations of the related art will become apparent to those of skill in the art upon a reading of the specification and a study of the drawings.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiments shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be adopted for purposes of enhancing the reader's understanding, with respect to the various views provided in the figures, and is in no way intended as being limiting.

Figure 1:
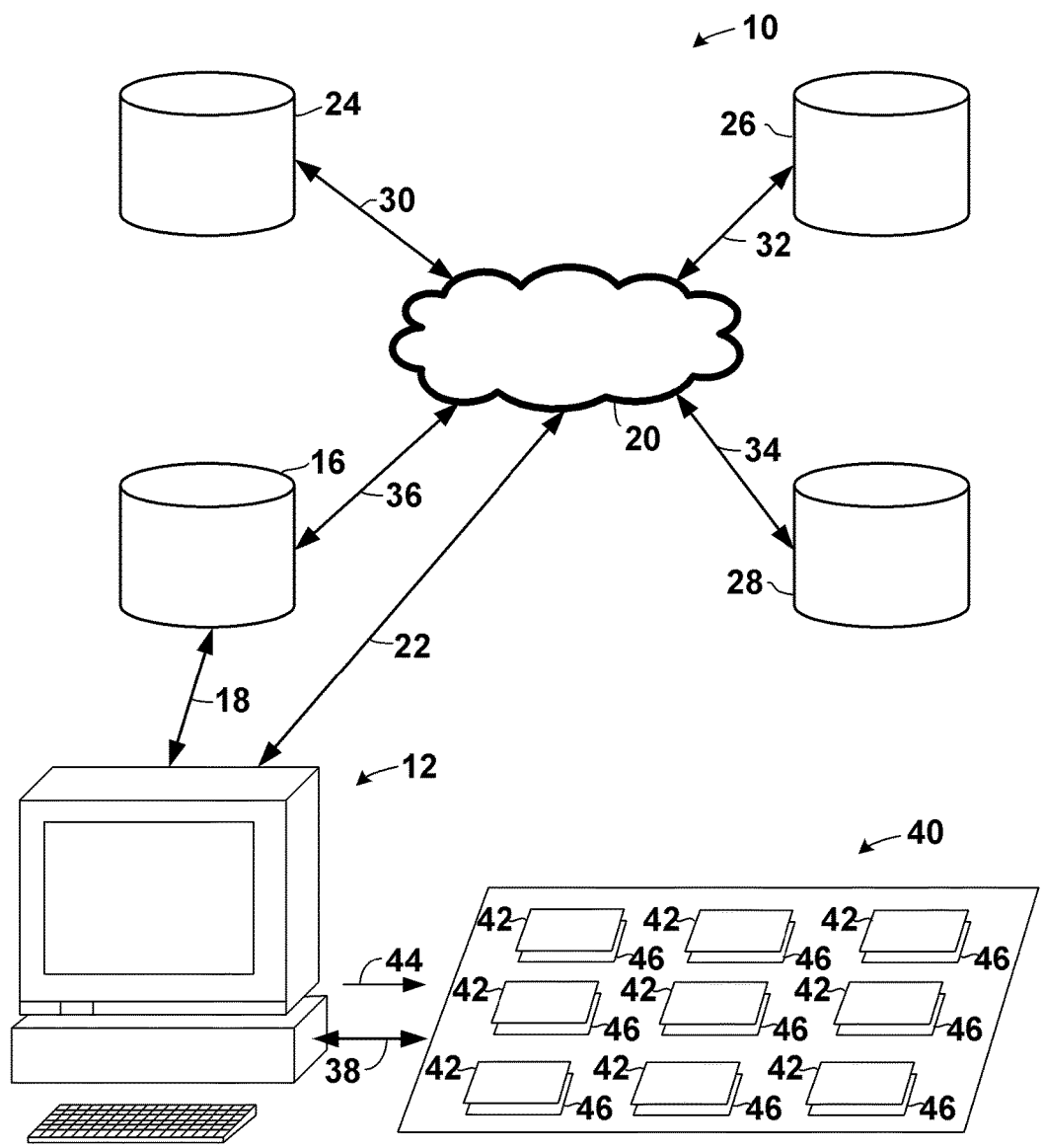
FIG. 1 is a block diagram which illustrates a system that is arranged according to an embodiment of the present disclosure.

Attention is now directed to the figures wherein like items may refer to like components throughout the various views. FIG. 1 is a diagrammatic representation of a non-volatile memory test system (e.g., a memory test station), produced according to an embodiment of the present disclosure, and generally indicated by the reference number 10. While typical memory test systems are arranged for testing memory units, memory test system 10 is configured for loading customer content into the memory following testing of the memory units, while remaining connected to the memory units, the advantages and details of which are discussed in detail below.

The memory test system includes a test computer 12 that can be interfaced with a local memory 16 through interface 18 and to the Internet 20 through internet connection 22. Additional memory 24, 26 and 28 can be interfaced to the Internet through interfaces 30, 32 and 34 and can be accessed by the memory test system through the Internet via memory 16 through a memory internet connection 36 and/or directly through the Internet over internet connection 22.

Still referring to FIG. 1, memory test computer 12 can include any resources that are necessary for purposes of performing memory tests that are of interest. Such tests include, for example, memory calibration, defect analysis and pass fail analysis. A data communication connection 38 is provided from the memory test computer to a test bed 40 that is configured to support a plurality of memory units 42. While nine memory units are illustrated, it should be appreciated that any number of one or more memory units can be tested. In an embodiment, a plurality of memory units can be simultaneously tested by memory test computer 12. The memory units can be received in the memory test bed in any suitable way such as, for example, using memory slots of well known configurations or of configurations yet to be developed and suitable electrical connectors. The memory units can include any suitable form of non-volatile memory such as, for example, Nand or NOR flash memory. The memory devices can be tested at any suitable point following their manufacture such as, for example, prior to final packaging and/or after final packaging.

Once memory test computer 12 has completed the test operation for one or more instances of memory unit 42, the memory test computer can utilize data connection 38 to transfer a content load 44 to one or more of the memory units. As will be further described, each memory unit can receive a customized content load based, for example, on a serial (e.g., identification) number that is unique to that memory unit. Each of the memory units can also receive a content load that is the same for each of the memory units in a specific batch of memory units. Memory test computer 12 can locate such customized sets of content load locally and/or remotely through the Internet.

Memory test computer 12 can be a computer that has a memory and a processor and which includes a download capability. Memory test computer 12 can be a testing controller that is configured for testing memory units and which is modified to transfer content load to the memory units. The content load can be stored internally in the memory test computer or externally on one or more memory, as shown in FIG. 1. In the embodiment shown in FIG. 1, the memory test computer has a downloading capability, however, this may not be required if the memory test computer stores the content load internally.

Memory test system 10 includes data communication connection 38 which is used for transferring information between memory test computer 12 and memory units 42. The data communication connection can be one or more cables, busses and/or other electrical signal carriers that electrically connect the memory test computer to each of the memory units. In the embodiment shown in FIG. 1, test bed 40 can be considered to be part of the data communication connection. Test bed 40 can be a socket board with sockets 46 that electrically connect with the memory units. Test bed 40 physically holds the memory units and maintains communication with data communication connection 38. The test bed can take other forms, so long as communication between the memory units and data communication connection 38 is established and the test bed provides a way to selectively connect the memory units to the test computer through the data communication connection for testing. Multiple testing interfaces can be provided with each one connectable to a different memory unit, including different types of interfaces connecting to different memory units.

The memory units, which can also be referred to as the Units Under Test (UUT), can be in a packaged form such as a Thin Small-Outline Package (TSOP), or a Ball Grid Array (BGA) with one or more memory die per packaged memory unit, or in an unpackaged form with one or more memory die. The memory unit can take the form of a single level die, or one or more die having multiple levels. The customer who purchases the memory unit for incorporation into a product can specify the characteristics of the memory unit, including packaging.

Figure 2:
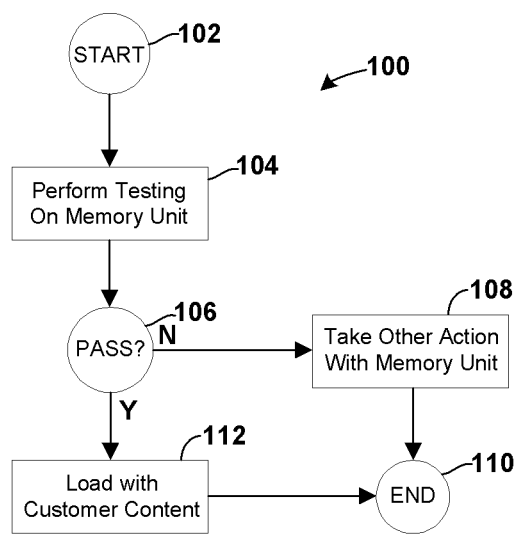
FIG. 2 is a flow diagram illustrating an embodiment of a method for the operation of the memory loading system of FIG. 1.

Referring now to FIG. 2, a method 100 for producing at least one non-volatile pre-programmed memory unit according to an embodiment of the present disclosure is illustrated. Method 100 begins at start 102 and proceeds to step 104, where the memory unit is tested using test computer 12. Following the testing at step 104, method 100 proceeds to step 106 where a determination is made by the test computer as to whether the memory unit has passed or failed the testing at step 104. If it is determined that the memory unit has failed the testing, then method 100 proceeds to step 108 where the memory unit can be disposed of, retested, repaired, or undergo other appropriate action. Following step 108, method 100 proceeds to step 110 where the method ends. If it is determined at step 106 that the memory unit has passed testing, method 100 proceeds to step 112 where the content load is loaded from the test computer onto the memory unit. The content load for loading into the memory unit can be provided by a customer that will receive the preloaded memory units or can be generated by the manufacturer or other third-party vendor to meet certain specifications provided by the customer. It should be appreciated that the connection between the test computer and the memory unit can be maintained between steps 104 and 112. That is, there is no need to disconnect the memory unit from its data communications connection to the test computer for purposes of loading the content load subsequent to testing. Following step 112, method 100 proceeds to step 110 where the method ends.

During the test, the test computer can monitor the testing activity and determine when the testing is complete. The test computer can accumulate information gathered from the testing when the testing is complete, or even while the testing of the memory unit is still occurring. Typically prior to beginning the testing, the test computer downloads test code to the memory unit which does not previously contain any data stored in the memory unit. The test code remains on the memory unit at least temporarily during testing, and in some instances can be removed following testing.

The memory unit can include an interface controller that can be a high level interface controller or lower level interface controller for interface to the memory cells in the memory unit. The memory unit interface controller can be used in the testing of the memory unit. The interface controller can be used for reading data from and writing data to the memory unit. Some high level controllers used for interfacing the memory unit include, by way of non-limiting example, Universal Serial Bus (USB), Multi Media Cards (MMC) and other types of communication and interface protocol. With such high level controllers, the controller can run microcode that is loaded into a controller memory. Other controllers can have lower level interface functionality and can have more limited capabilities; these may take the form of a sequencer, for instance, that uses sequencer code stored in a sequencer memory. A unique serial number for each of the different memory units can be located in the controller microcode or sequencer code for identifying the individual memory unit. One or more serial numbers associated with the memory unit or interface arrangement can be stored in the memory unit.

Generally, the type of interface controller that is provided as part of the memory device can establish the level of sophistication of the testing that is performed. In the example of a device having a low-level interface controller, the testing can produce a flaw map. In the example of a device having a high-level interface controller, the testing can produce more sophisticated results such as, for example, datasets for subsequent statistical analysis.

Typically, the interface controller type is matched to the type of memory product that the memory unit is intended to be used in. The interface for connecting to the memory units can be for example: serial, USB, SD, MMC, ONFi, something simple or something complex. For instance, an interface controller with USB protocol capabilities can be used in a memory unit that will be used in a USB memory product. However, the USB controller is not needed unless the memory unit is going to be a USB product and one may not want to use the interface controller for testing and content loading purposes in some instances. Other types of protocols can be used in conjunction with or as a replacement for high level interface controllers in testing and content loading, including protocols typically only used for testing, such as Joint Test Action Group (JTAG), or a combination of JTAG and I2C or some other type of interface that is not necessarily a high level interface. This way, even if a high level interface is available, the high level interface does not have to be used. In these cases, there can be a serial interface from the test computer to the memory units.

Even if the testing does not use the high level interface, the high level interface can be used for loading content load into the memory. In some instances it may be beneficial to test the memory unit using one interface and load the content into the memory using another interface. The use of separate interfaces for testing and loading of the content could provide advantages in content loading performance and an overall higher memory unit throughput through the testing and content loading procedure. However, loading the content and testing through the same interface can increase efficiency since only a single interface has to be connected and removed. In this instance, testing and loading content can be accomplished through the single connection without disconnecting the memory unit between testing and content loading.

The memory unit may be able to perform self testing to at least some degree depending on the level (e.g., sophistication) of the interface controller. More sophisticated interface controllers can perform more complex self testing of the memory unit. In some instances, the memory units can be powered and provided with test code instructions defining a self test procedure. In other instances, the memory units can be provided with test code instructions that define testing involving some degree of interaction between the memory unit and the test computer during the testing. On one end of the testing spectrum, the test computer loads the test code and the memory unit performs self testing such that the test computer at least manages the testing through data communication connection 38, on the other end of the testing spectrum, the test computer can completely perform the testing by communicating through data communication connection 38. In either case, the test computer can monitor the status of the test. When the test has been completed, the test computer either has the results of the test, if the test computer completely performs the testing, or uploads at least a portion of the test results from the memory unit. Memory units that pass the test exhibit functional capabilities which allow them to be used in the memory product.

The content load loaded at step 112 can be anything that the customer would like to have stored in the memory unit, including information that the customer would heretofore load onto the memory unit. In some instances, the content load may include advertising material or sample software. The content load may also include operating instructions or encryption code. As will be further described, the customer may desire that at least some portion of the content load provide an increased level of operational reliability as compared to other data to be stored in the memory unit.

The content load can be provided directly to the manufacturer for storage on local memory 16. In this instance, the content load is not transferred through the Internet and is provided to the manufacturer on some sort of memory device and is then loaded onto the local memory. The test computer then retrieves the content load from the local memory to load the content load on the memory units through the data communication connection. In another embodiment, the content load is transferred from Internet 20 to local memory 16 through the local memory Internet connection. The test computer can then retrieve the content load from the local memory to load the content load onto the memory units.

In another embodiment, the content load can be loaded through the Internet. In this embodiment, the content load can be stored in one or more of the additional memories 24, 26 and 28 and transferred to the test computer through the one or more of memory interfaces 30, 32 and 34, Internet 20 and Internet connection 22. The additional memory can be provided by the customer and/or by a third party either under the direction of the manufacturer and/or the customer. The additional memory can provide limited access so that only authorized users can gain access to the content load either for modification or for download.

Figure 3:
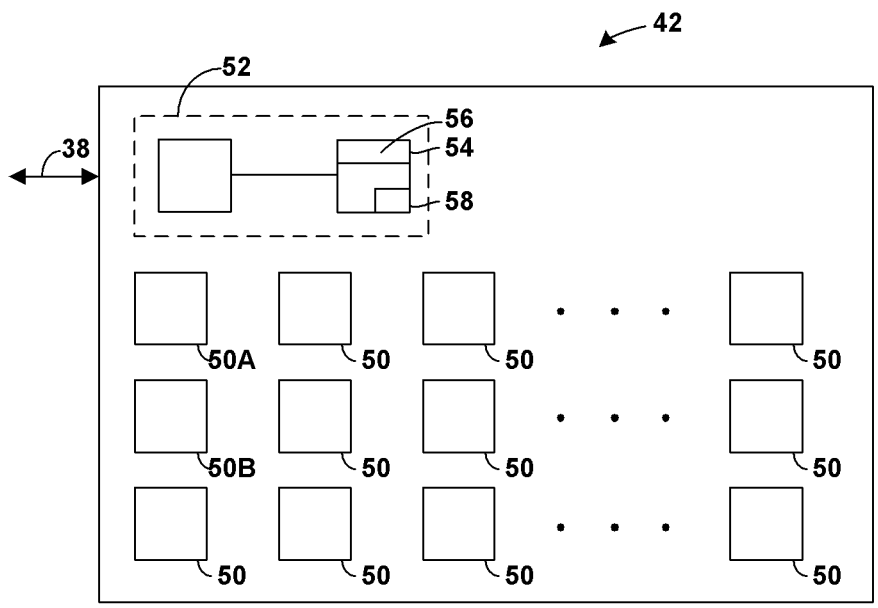
FIG. 3 is a block diagram which illustrates an embodiment of a memory unit which can be loaded with content according to the flow diagram of FIG. 2.

FIG. 3 illustrates one memory unit 42 showing multiple blocks 50 of memory cells. Memory unit 42 includes a controller 52 that includes memory 54 in which is stored micro-code 56 and a serial number 58. Different blocks of memory in memory unit 42 can have different performance characteristics. In this instance, a memory block 50A has one bit error rate that is lower than another bit error rate of memory block 50B. Since the bit error rate in memory block 50A is lower than the bit error rate of memory block 50B, the content can be loaded into block 50A to provide a relative increase in reliability of the stored content. The relative difference in bit error rates can be attributed to defects in the memory unit, for instance. Testing the memory unit can produce a map of these or other performance characteristics in the different areas of the memory unit which can be stored and used by the test computer when determining where to load the content into the memory unit. The content can be allocated block by block based on performance characteristics or within any particular unit of memory so long as different areas of the unit of memory are characterizable as having different values of performance characteristic. Since this testing information is available to the manufacturer, the manufacturer can use the testing information to load the content into the memory unit to produce more reliable storage of the content load as compared to the customer who does not have access to the testing information.

Figure 4:
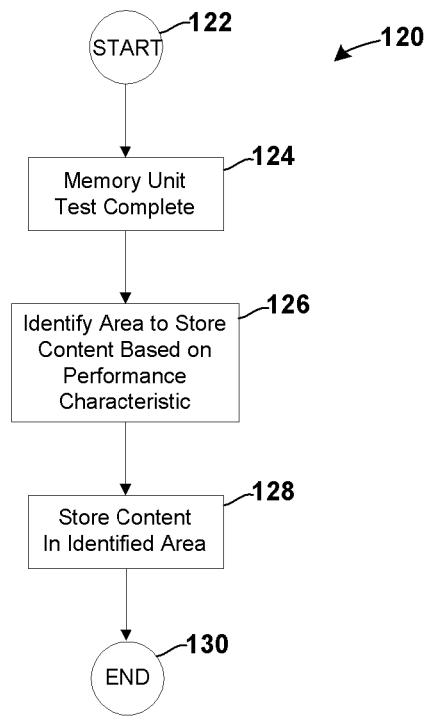
FIG. 4 is a flow diagram illustrating an embodiment of a method for the operation of the system of FIG. 1 using performance characteristics of the memory unit.

Referring now to FIG. 4, a method is illustrated, generally indicated by the reference number 120 for utilizing a performance characteristic, previously obtained responsive to testing, when storing the content load in the memory unit. Method 120 begins at a start step 122 and proceeds to a step 124 where a determination is made that the test has been completed by test computer 12. Method 120 then proceeds to a step 126 where an area to store the content load is identified based on one or more performance characteristics obtained as a result of the testing. Performance characteristics can be related to reliability, calibration information, defect information, or other characteristics which can be determined as a result of testing and which relate to the performance of the storage capabilities of the memory unit. Performance characteristics can also be related to other parameters of the memory unit that are not necessarily related to the test or test results, for instance choosing an area of the memory that can support a desired bit density per cell to increase reliability. Following step 126, method 120 then proceeds to step 128 where the content load is loaded into the memory unit in the identified area. Method 120 then proceeds to step 130 where the method ends.

In some instances the content load can be considered to be important and it can be desirable to increase the read back reliability and/or longevity of the storage of the content load. Important customer content load data can be an operating system or instructions for running a program on the memory, or other data that should never be erased or corrupted. This important data can be different and specific to each customer. Generally, increased reliability of the content load can be accomplished by storing the content load in an area of the memory unit having more reliable memory characteristics; or by using other methods to increase reliability that do not involve using more reliable memory characteristics, as described below, or a combination of both.

Every memory unit has different performance characteristics, so the characteristics for individual memory units can serve as guidance for locating the content load in the memory unit. Different performance related characteristics of the memory unit can be identified during testing. These performance characteristics can be related to the speed at which data can be written or read from different areas of the memory, commonly referred to as data throughput; reliability performance of the storage, which is related to the read and write accuracy of the data stored in the memory area; and/or retention performance which is related to how long the data can be accurately stored.

Some performance related characteristics of the memory unit can be determined during testing. Some blocks of memory in the memory unit can perform better than other blocks of memory. Testing can determine which blocks perform better and these better performing blocks can be selectively used for storing the customer content load. For instance, testing can determine the bit error rates of different areas of the memory unit and an area with a bit error rate that is lower than other areas can be selected to be used to store at least a selected portion of the content load, thereby yielding higher reliability of the data. Another performance related characteristic that can be used for this purpose is the standard deviation results of the blocks which are related to the width of the distribution of charge in the cells of the blocks. Another performance related characteristic is the level error rate of different areas of the memory unit. Still other performance characteristics are related to plane defects or other defects.

In some memory systems, the memory units include spare blocks of memory that can be used as replacements for memory blocks that have gone bad during the operational lifetime of the memory system. The manufacturer has access to these spare blocks and can use one or more of the spare blocks to store the customer content load. This can be advantageous since the storage in the spare block does not take up any of the storage space for which the consumer is paying.

The testing results can also be used to identify areas in the memory unit where it would be undesirable to store the content load. These areas could have lower than average reliability, for instance due to high bit error rates, plane defects or other types of defects in these areas and these areas can be avoided when storing the content load to increase reliability.

Other methods can also be used to increase reliability without involving testing. For instance, instead of using the memory cells in multi-bit mode, the cells can be used in single bit mode. In this arrangement, the cells need only store a binary high or low value instead of multiple values representing multiple bits. The single bit mode is more reliable than multi-bit mode although the single bit mode uses more space. Another advantage gained with single bit mode can be an increased data transfer rate across the interface as compared to multi-bit mode. If the customer content load is an application or other data that is read many times, then read disturb can be a concern. Single bit mode can be more reliable than multi-bit mode for these applications as well.

Another way to increase reliability can include adding supplemental Error Correcting Code (ECC) to the content load data. The data can also be encoded differently, in a more reliable fashion, which is effectively the same as adding more ECC. Additional or supplemental ECC can be added to the customer data along with more reliable encoding to improve reliability.

Yet another way in which to increase reliability of the content load as written to the memory unit is for the testing computer to write the data with an increased accuracy. When writing data to the memory unit, there is a balance between good speed performance and accuracy. Data can be written with pulses in an iterative manner until the desired charge level in the memory cell is reached. When writing the customer data, smaller pulse steps (e.g., increments) can be used to write the data more accurately. The write operation can take longer when using smaller pulse steps, but the data can be written more accurately. By writing with finer pulses, a finer resolution is achieved and the writing operation is less likely to overshoot a target charge level than if larger pulse steps are used. When the pulses do overshoot the target charge level, finer pulses can decrease the amount of overshoot in comparison to larger pulse steps.

Figure 5:
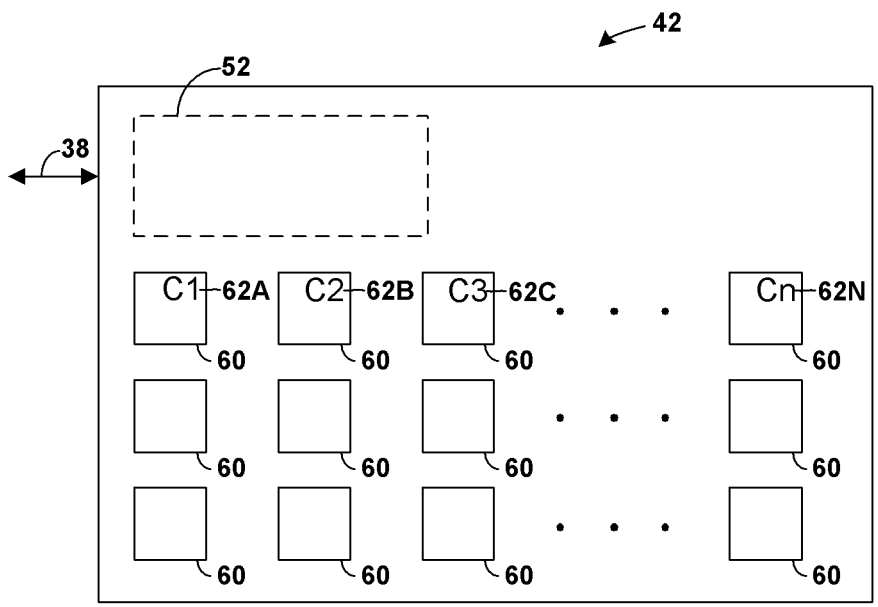
FIG. 5 is a block diagram which illustrates an embodiment of the memory unit after the memory unit has been loaded with multiple copies of the content by the memory loading system of FIG. 1.

FIG. 5 illustrates a single memory unit 42 having multiple blocks 60 of memory. In this embodiment, the memory unit is loaded with multiple copies 62*a*-62*n* of the content load. The manufacturer can place redundant copies of the customer content into the memory units for improved reliability. The copies of the customer content can be transparent to the customer so that in case of a fault with one copy, another copy can be used without the knowledge of the customer. Controller 52 can handle such operations, especially if the controller is a high level controller such as used for USB, MMC and SD interfaces, as non-limiting examples. In embodiments using multiple copies, the processor can determine that in the event that there are too many errors in copy 62*a* then the processor can use one of copies 62*b*-62*n*. The decision as to whether there are too many errors in a copy can be based on whether ECC appropriately corrected the data to an acceptable bit error rate. Other metrics can also be used to determine which copy to run. The multiple copies do not have to be transparent to the customer and/or end user.

This can depend on the sophistication level of the customer and/or the amount of control that the customer desires.

Redundant copies may also be used to repair another copy to within an acceptable range of bit error rates. If the customer content is damaged or is made less reliable because of soldering or for other reasons over the life of the product, the controller can automatically or independently repair and restore the content. The controller can check the metrics of the data and determine if the data is as good as it should be. The controller can then refresh the data in a suitable manner.

Figure 6:
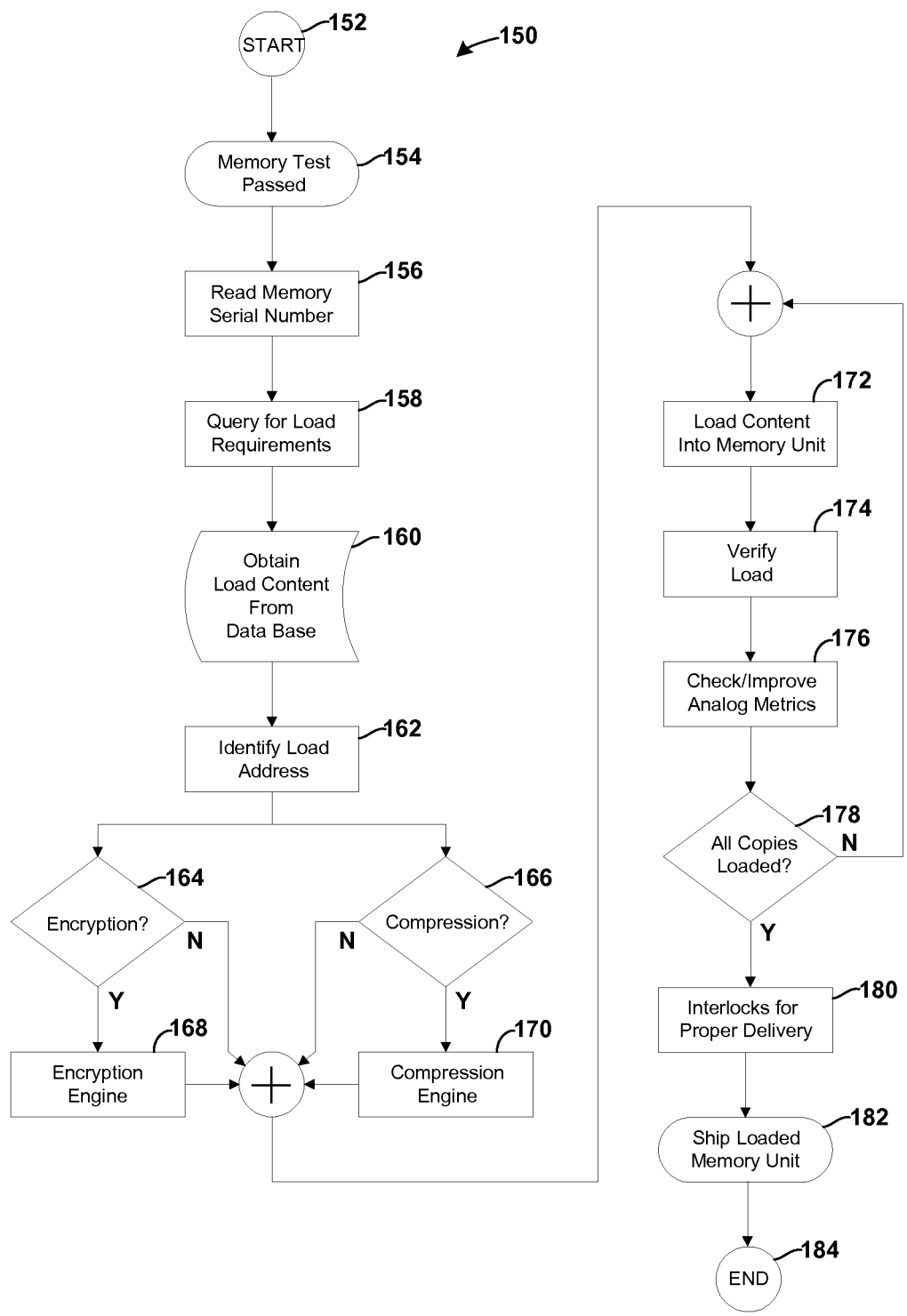
FIG. 6 is a flow diagram illustrating embodiments of a method for the operation of the system of FIG. 1, including loading of the multiple copies of FIG. 5.

Referring now to FIG. 6, a method, generally indicated by the reference number 150 is shown illustrating an embodiment for producing a pre-programmed memory unit. It should be appreciated that features of method 150 can be selectively imported into method 100 with respect to loading of the customer content into the memory unit. Method 150 starts at start 152 and then proceeds to 154 where it is determined that the memory unit has passed the testing. Method 150 then proceeds to 156 where the serial number, such as serial number 58 in FIG. 3, is read from the memory unit by test computer 12 (FIG. 1). Method 150 then proceeds to 158 where the test computer queries for load requirements based on the serial number. The load requirements can be stored on one or more of the memories, either local memory 16 or additional memory 24, 26 or 28. Once the load requirements for the memory unit with the specific serial number read from the memory unit are found, the method proceeds to 160 where the required load content is obtained from the memory by the test computer.

Method 150 then proceeds to 162 where the location for storing the content load in the memory unit is identified. This location can be determined as previously discussed based on performance characteristics or other parameters of the memory unit. Following 162, method 150 proceeds to 164 and 166. At 164 a determination is made as to whether the content load will be encrypted or not. This determination can be made based on the preferences of the customer, if the content load is to be encrypted, then method 150 proceeds to 168 where encryption is applied to the content load before method 150 proceeds to 172. If the content load is not to be encrypted, then method 150 proceeds directly to 172. At 166 a determination is made as to whether the content load is to be compressed. This determination can also be made based on the preferences of the customer. If the determination at 166 is that the content load will be compressed, then method 150 proceeds to 170 where the content load is compressed. The method 150 then proceeds to step 172. If the content load is not to be compressed, then method 150 proceeds directly to step 172. While the encryption and compression processes appear to be operating in parallel, it should be appreciated that encryption and compression are applied in series to the data stream such that either encryption or compression can be performed first.

The content load is loaded into the memory unit at 172 in the location determined in 162. Method 150 then proceeds to 174 where the content load is verified to confirm that it was written correctly into the memory. Method 150 then proceeds to 176 where the analog metrics of the stored content load are checked, and if required, improved. These analog metrics can include the variance (e.g., standard deviation) of the content. Following 176, method 150 proceeds to 178 where a determination is made as to whether more than one copy is to be loaded and, if so, have all of the copies been loaded. The determination as to whether more than one copy is to be loaded can be made based on the preferences of the customer. If more than one copy is to be loaded, then method 150 returns back to repeat 172, 174 and 176 until all of the copies have been loaded, at which point method 150 proceeds to 180. If only one copy is to be loaded then method 150 proceeds to 180 without returning to 172. At 180, the manufacturer sets interlocks to prepare the memory unit for delivery in the proper packaging for a particular customer. Interlocks can be used, for example, to insure that the correct content is delivered to a particular user. Method 150 then proceeds to 182 where the memory unit, as loaded with customer content, is shipped to the customer. Method 150 then ends at 184.

Several advantages can be gained by pre-programming memory units with customer content at the manufacturer. For example, the customer does not have to spend production time and money attendant to connecting to the memory unit to an appropriate system for loading customer content since the manufacturer has already loaded the customer content from a test computer through the data communication connection used for testing. Therefore, for at least this reason, production costs and time for the customer can be reduced without a corresponding increase in production cost and time for the manufacturer. Further, the manufacturer has access to characteristics of the memory unit obtained from testing that can be used to increase the performance of the customer content load stored in the memory unit. Other methods can be used by the manufacturer to increase the reliability of the customer content load, including using redundant copies and spare blocks of memory.

An apparatus for managing at least one non-volatile memory unit has been disclosed. The apparatus includes a computer at least for managing testing of the non-volatile memory unit and a data communication connection. The data communication connection is configured to connect the computer to the memory unit. The computer at least manages testing of the memory unit through the data communication connection and thereafter loads a predetermined set of content into the memory unit in response at least to the memory unit passing the testing. In a disclosed method, testing of a memory unit is at least managed using a memory test system and responsive at least to passing the testing, a predetermined set of content is loaded from the system into the memory unit to produce a pre-programmed memory unit.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. A method, comprising:
   temporarily connecting at least one memory die, in an unpackaged form, directly to a memory test system for data communication between the memory test system and the memory die;
   testing the memory die through the data connection using the memory test system;
   subsequent to testing the memory die, loading a predetermined set of content from the memory test system directly into the memory die using the data communication connection to produce a pre-programmed memory die; and
   packaging the memory die for subsequent incorporation into a memory product.

2. The method of claim 1 wherein the testing is post-manufacture testing with no data previously stored in the memory die.

3. The method of claim 1 further comprising:
maintaining the data communication connection between the memory test system and the memory die during testing and loading of the memory die; and
removing the data communication connection from between the memory test system and the memory die following the loading of the memory die.

4. The method of claim 1 wherein the testing further comprises identifying an area in the memory die for storing the predetermined set of content based on a defect map of the memory die.

5. The method of claim 1 wherein the testing includes generating calibration information and the loading includes locating the predetermined set of content in the memory die based on the calibration information.

6. The method of claim 1 wherein the testing includes generating defect information and the loading includes locating the predetermined set of content in the memory die based on the defect information.

7. The method of claim 1 wherein loading includes encrypting the predetermined set of content.

8. The method of claim 1 wherein loading includes compressing the predetermined set of content.

9. The method of claim 1 wherein loading includes receiving an initial set of content and customizing the initial set of content to produce the predetermined set of content.

10. The method of claim 9 wherein customizing includes changing the initial set of content such that a particular long term reliability would be provided by loading the initial set of content into the memory die and wherein loading the customized set of data as the predetermined set of data results in an enhanced long term reliability.

11. The method of claim 1 including retrieving at least a portion of the predetermined set of content through the Internet.

12. The method of claim 11 wherein the portion includes media file content.

13. The method of claim 1 wherein the memory die includes a serial number and the method further comprises:
before the loading, reading the serial number from the memory die;
initiating a query to identify the predetermined set of content based on the serial number read;
retrieving the predetermined set of content based on the query; and
providing the predetermined set of content to the loading.

14. The method of claim 1 further comprising:
verifying the predetermined set of content in the memory die after the loading and, thereafter, checking analog metrics of the predetermined set of content in the memory die.

15. The method of claim 14 wherein checking the analog metrics comprises determining a variance of the predetermined set of content in the unpackaged memory die.

16. The method of claim 1 wherein loading uses a sequencer interface that forms part of the memory die.

17. A testing system, comprising:
at least one unpackaged memory die;
a computer at least for managing the testing of the unpackaged memory die;
an Internet connection to the computer for retrieving a predetermined set of content through the Internet; and
a data communication connection for temporarily directly connecting the computer to the unpackaged memory die and where the computer is configured to manage testing of the unpackaged memory die through the data communication connection and thereafter load the predetermined set of content into the unpackaged memory die in response to at least an indication that the testing is complete and that the memory die passed the testing.

18. The testing system of claim 17 wherein the unpackaged memory die includes a sequencer interface for data communication with the computer.

19. The testing system of claim 17 wherein the unpackaged memory die is an unpackaged multi-level memory die.

20. The testing system of claim 17 wherein the unpackaged memory die is an unpackaged single level memory die.

21. A method comprising:
performing testing of an unpackaged memory die using a memory test system including making a direct data communication connection between the memory test system and the unpackaged memory die; and
responsive at least to passing the testing, loading a predetermined set of non-testing content from the memory test system into the unpackaged memory die using the data communication connection to produce an unpackaged pre-programmed memory die.

22. A method for producing an unpackaged memory die for incorporation into a memory product, comprising:
temporarily connecting the unpackaged memory die to a memory test system;
while the unpackaged memory die is connected to the memory test system, testing the unpackaged memory die using the memory test system; and
responsive to completion and passing of the testing and while the unpackaged memory die remains connected to the memory test system, loading a predetermined set of content from the memory test system into the unpackaged memory die to produce a pre-programmed unpackaged memory die.

23. A method as defined in claim 22, further comprising:
subsequent to loading the predetermined set of content into the unpackaged memory die, disconnecting the unpackaged memory die from the memory test system; and
incorporating the unpackaged memory die into the memory product.

24. A method as defined in claim 22, further comprising:
subsequent to loading the predetermined set of content into the unpackaged memory die, disconnecting the unpackaged memory die from the memory test system; and
incorporating the unpackaged memory die into the memory product.

25. A method, comprising:
at least managing testing of an unpackaged memory die using a memory test system;
providing a data connection from the unpackaged memory die directly to the memory test system for performing the testing; and
subsequent to testing the unpackaged memory die, loading a predetermined set of content from the memory test system into the unpackaged memory die using the data communication connection to produce a pre-programmed unpackaged memory die as an intermediate product for incorporation into a memory product that is produced for an end user which intermediate product is not configured for direct use by the end user.

26. The method of claim 1 wherein loading uses a sequencer interface that forms part of the unpackaged memory die.

27. The method of claim 14 wherein checking the analog metrics comprises determining a variance of the predetermined set of content in the unpackaged memory die and refreshing the predetermined set of content in the unpackaged memory die responsive to checking the analog metrics.

* * * * *